(12) United States Patent
Zhu et al.

(10) Patent No.: US 9,847,211 B2
(45) Date of Patent: Dec. 19, 2017

(54) CONDUCTIVE FILM AND METHOD OF MAKING SAME

(71) Applicants: Yu Zhu, Copley, OH (US); Tianda He, Cuyahoga Falls, OH (US)

(72) Inventors: Yu Zhu, Copley, OH (US); Tianda He, Cuyahoga Falls, OH (US)

(73) Assignee: The University of Akron, Akron, OH (US)

( * ) Notice: Subject to any disclaimer, the term of this patent is extended or adjusted under 35 U.S.C. 154(b) by 0 days.

(21) Appl. No.: 15/111,866

(22) PCT Filed: Jan. 16, 2015

(86) PCT No.: PCT/US2015/011678
§ 371 (c)(1),
(2) Date: Jul. 15, 2016

(87) PCT Pub. No.: WO2015/109137
PCT Pub. Date: Jul. 23, 2015

(65) Prior Publication Data
US 2016/0358747 A1 Dec. 8, 2016

Related U.S. Application Data

(60) Provisional application No. 61/928,019, filed on Jan. 16, 2014.

(51) Int. Cl.
*B44C 1/22* (2006.01)
*C03C 15/00* (2006.01)
(Continued)

(52) U.S. Cl.
CPC ...... *H01J 37/32009* (2013.01); *C23C 14/185* (2013.01); *C23C 14/205* (2013.01);
(Continued)

(58) Field of Classification Search
USPC .......................................... 216/41
See application file for complete search history.

(56) References Cited

U.S. PATENT DOCUMENTS 3,664,899 A 5/1972 Wright et al.
4,670,097 A 6/1987 Abdalla et al.
(Continued)

OTHER PUBLICATIONS

Jelinek, R. Biometics. Germany: Hubert &Co. KG, 2013; ISBN 978-3-11-028117-0; pp. 21-22.

*Primary Examiner* — Roberts Culbert
(74) *Attorney, Agent, or Firm* — Renner Kenner Greive Bobak Taylor & Weber

(57) ABSTRACT

A method for making a conductive film includes the steps of: depositing a conductive metal film on a substrate to form a metal-coated substrate; depositing a fiber pattern on the conductive metal film of the metal-coated substrate to form a masked substrate, the fiber pattern defining protected metal and exposed metal of the conductive metal film; removing the exposed metal from the conductive metal film of the masked substrate to form a protected conductive film; and removing the fiber pattern from the protected conductive film to expose the protected metal and provide a metal pattern on the substrate. An annealing step con be employed after depositing the fiber pattern to increase the surface area of contact between the fiber pattern and the conductive metal film.

18 Claims, 1 Drawing Sheet

| (51) | Int. Cl. | |
|---|---|---|
| | C03C 25/68 | (2006.01) |
| | C23F 1/00 | (2006.01) |
| | H01J 37/32 | (2006.01) |
| | C23F 1/02 | (2006.01) |
| | G03F 7/00 | (2006.01) |
| | G06F 3/041 | (2006.01) |
| | H01L 51/00 | (2006.01) |
| | C23C 14/18 | (2006.01) |
| | C23C 14/20 | (2006.01) |
| | C23C 14/58 | (2006.01) |
| | C23C 16/44 | (2006.01) |
| | C23C 18/31 | (2006.01) |
| | C25D 3/38 | (2006.01) |
| | C25D 5/48 | (2006.01) |
| | C25D 5/50 | (2006.01) |
| | C25D 5/54 | (2006.01) |
| | G03F 7/42 | (2006.01) |
| | H01L 21/3213 | (2006.01) |
| | H01L 51/44 | (2006.01) |
| | G02F 1/1343 | (2006.01) |

(52) U.S. Cl.
CPC ........ *C23C 14/584* (2013.01); *C23C 14/5806* (2013.01); *C23C 14/5826* (2013.01); *C23C 14/5873* (2013.01); *C23C 16/44* (2013.01); *C23C 18/31* (2013.01); *C23F 1/00* (2013.01); *C23F 1/02* (2013.01); *C25D 3/38* (2013.01); *C25D 5/48* (2013.01); *C25D 5/50* (2013.01); *C25D 5/54* (2013.01); *G03F 7/0002* (2013.01); *G06F 3/041* (2013.01); *H01L 51/0023* (2013.01); *G02F 1/13439* (2013.01); *G03F 7/00* (2013.01); *G03F 7/42* (2013.01); *G03F 7/427* (2013.01); *H01J 2237/334* (2013.01); *H01L 21/32134* (2013.01); *H01L 21/32139* (2013.01); *H01L 51/442* (2013.01)

(56) References Cited

U.S. PATENT DOCUMENTS

| 6,331,380 B1 | 12/2001 | Ye et al. |
| 6,342,307 B1 | 1/2002 | Menezes et al. |
| 8,641,912 B2 * | 2/2014 | Heath .................. B82Y 10/00 216/2 |
| 2008/0182081 A1 | 7/2008 | Jeon et al. |

* cited by examiner

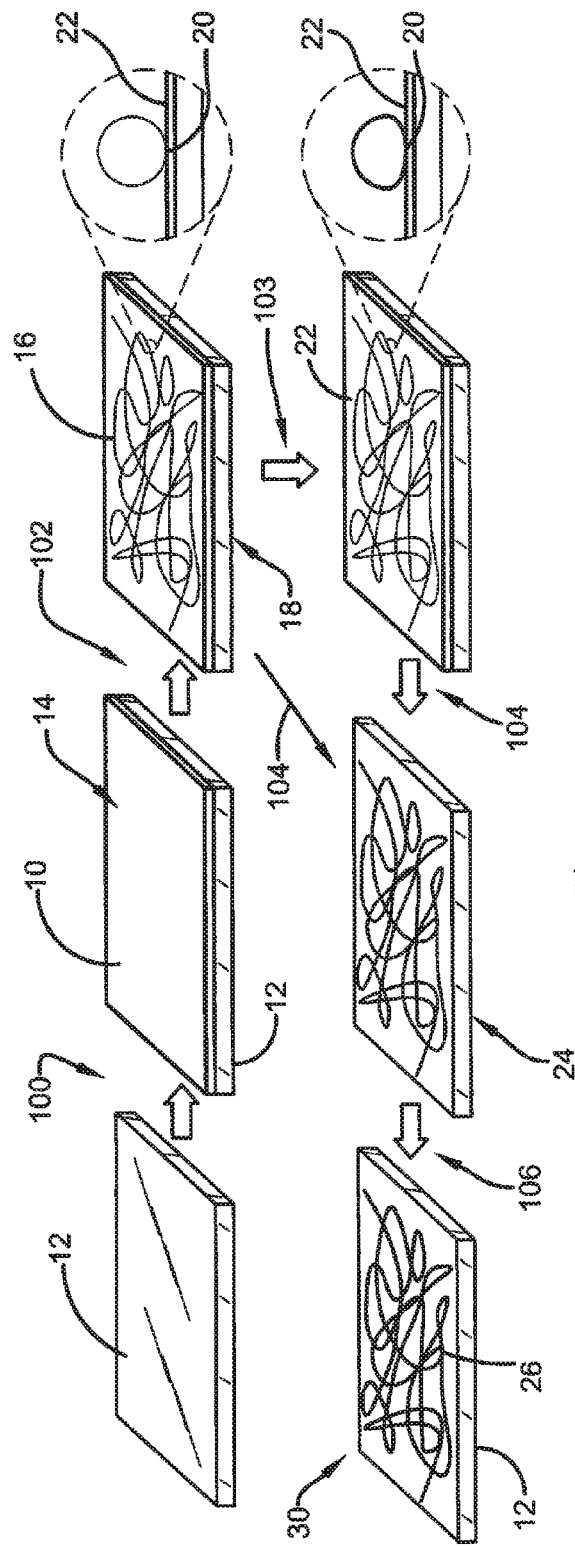

CONDUCTIVE FILM AND METHOD OF MAKING SAME

FIELD OF THE INVENTION

The present invention generally relates to conductive films and methods for their creation. In particular embodiments, the present invention relates to transparent conductive films and methods for their creation. In particular embodiments, the present invention relates to flexible conductive films and methods for their creation. In particular embodiments, the present invention relates to transparent electrodes and methods for their creation. In particular embodiment, the present invention relates to flexible and rigid touch screens and methods for their creation.

BACKGROUND OF THE INVENTION

Transparent electrodes are essential parts for many optoelectronic devices such as touch screens, liquid crystal display, and solar cells. Currently, commercial transparent electrodes are made from indium doped tin oxide. The cost of indium and the brittle nature of ITO drive the search for alternative transparent electrode materials. During the past decade, many alternative transparent electrode materials were studied, for instance: conducting polymers, graphene, carbon nanotube (CNT), metal nanowire, and hybrid materials. Those materials can be categorized into two forms: the continuous transparent conductive film (graphene, ITO and conducting polymer) and transparent percolation-conductive film (CNT, metal nanowire and hybrid materials).

In continuous transparent conductive materials, graphene has the highest carrier mobility and optical transparency. Such performance is only available on small, nonscalable mechanically cleaved graphene. The large graphene samples from other sources, such as chemical vapor deposited graphene and solution-processed, reduced graphene oxide, cannot provide comparable perfection (carrier mobility) as small cleaved graphene. The carrier mobility in large area graphene samples is limited by the production techniques, so doped graphene was developed by several groups to enhance the conductivity by increasing the carrier density. Some doped graphene based transparent electrodes exhibit performance similar to ITO. The doped graphene sheets are less stable than the pristine graphene and the fabrication cost are likely to be larger. The high processing cost (such as chemical vapor deposition) and tedious transferring processes hinder its use in transparent electrodes. As a result, ITO is presently the best choice for continuous transparent electrode materials due to its combined properties of performance, cost, stability, and toughness.

The transparent percolation-conductive film is another emerging material for making high performance transparent electrodes. In contrast to continuous transparent conductive film, the transparent percolation conductive film can be made from opaque materials such as carbon nanotubes (CNTs) and metal nanowires. Carbon nanotubes are used to make transparent electrodes because of their extremely high conductivity and aspect ratio. The transparent electrodes made of CNTs are poorer than ITO due to the presence of semiconductive single walled carbon nanotubes and high contact resistance. Metal nanowire transparent electrodes have emerged as better transparent electrodes than CNT electrodes. The best solution-processed copper nanowire and silver nanowire based electrodes exhibit better performance than ITO. However, the solution-processed metal nanowires often contain organic residues that result in lower conductivity in comparison with that of patterned metal nanowire made from evaporated metal. Recent research also indicates that solution-processed metal nanowire transparent electrodes may have poor adhesion and protrusions that limit their use in many devices. Patterned metal nanowires from evaporated metal sources exhibit the best transparent electrode performance. However, a high throughput patterning method to generate the high aspect ratio nanowires are crucial for this type of transparent electrode.

Electrospinning is a facile and economical way to produce continuous nanofiber structures. Previously, it was used to generate continuous conductive nanofibers for transparent electrodes. The directly electrospun conductive nanofibers are usually polymer metal composites. A heat treatment annealing process is required to eliminate the organic residue and obtain reasonable conductivity. This process is not only energy and time-consuming but also limited to substrates that are stable at high temperatures. Cui's group coated metal on continuous electrospun fibers. Wu, H.; Kong, D.; Ruan, Z.; Hsu, P. C.; Wang, S.; Yu, Z.; Carney, T. J.; Hu, L.; Fan, S.; Cui, Y. A Transparent Electrode Based on a Metal Nanotrough Network. Nat. Nanotechnol. 2013, 8, 421-425. The small diameter and ultralong fiber lead to a metal nanotrough network electrode with remarkable performance (sheet resistance 2Ω/□ at 90% transmittance). However, the metal nanotrough network needs to be transferred onto the target substrate, which generates defects and requires additional care to ensure adhesion. It has also been demonstrated that a patterned metal mesh with graphene can provide excellent transparent electrode (sheet resistance 20Ω/□ at 91% transmittance). Zhu, Y.; Sun, Z.; Yan, Z.; Jin, Z.; Tour, J. M. Rational Design of Hybrid Graphene Films for High-Performance Transparent Electrodes. ACS Nano 2011, 5, 6472-6479. This method involves expensive photolithography.

In light of the current state of the art, there is a need in the art for methods to fabricate transparent electrodes with high performance, low cost, and high throughput that can replace ITO.

SUMMARY OF THE INVENTION

In a first embodiment, the present invention provides a method for making a conductive film. The method comprises the steps of depositing a conductive metal film on a substrate to form a metal-coated substrate, depositing a fiber pattern on the conductive metal film of the metal-coated substrate to form a masked substrate, the fiber pattern defining protected metal and exposed metal of the conductive metal film, removing the exposed metal from the conductive metal film of the masked substrate to form a protected conductive film and removing the fiber pattern from the protected conductive film to expose the protected metal and provide a metal pattern on the substrate.

In a second embodiment, the present invention provides a method for making a conductive film as in the first embodiment, wherein the method further comprises annealing the fiber pattern of the masked substrate to increase the surface area of contact between the fiber pattern and the conductive metal film.

In a third embodiment, the present invention provides a method for making a conductive film as in either the first or second embodiment, wherein the substrate is a transparent substrate.

In a fourth embodiment, the present invention provides a method for making a conductive film as in any of the first through third embodiments, wherein the substrate is selected from glass, quartz, transparent polymer film, and transparent oxide.

In a fifth embodiment, the present invention provides a method for making a conductive film as in any of the first through fourth embodiments, wherein the conductive metal is selected from copper, nickel, aluminum, tungsten, titanium, chromium, iron, zinc, zirconium, niobium, molybdenum, tin, indium, silver, gold, platinum, lead, vanadium, manganese, cobalt, palladium and alloys of the foregoing.

In a sixth embodiment, the present invention provides a method for making a conductive film as in any of the first through fifth embodiments, wherein the conductive metal film is deposited by a method selected from electron beam evaporation, electroless plating, electroplating, chemical vapor deposition, and sputtering.

In a seventh embodiment, the present invention provides a method for making a conductive film as in any of the first through sixth embodiments, wherein the conductive metal film in the metal-coated substrate is less than 1000 microns thick.

In an eighth embodiment, the present invention provides a method for making a conductive film as in any of the first through seventh embodiments, wherein the fiber pattern is formed of a polymer.

In a ninth embodiment, the present invention provides a method for making a conductive film as in any of the first through eighth embodiments, wherein the fiber pattern is formed of fibers having a diameter of less than 100 microns.

In a tenth embodiment, the present invention provides a method for making a conductive film as in any of the first through ninth embodiments, wherein the fiber pattern is formed of fibers having a diameter of less than 1 micron.

In an eleventh embodiment, the present invention provides a method for making a conductive film as in any of the first through tenth embodiments, wherein the fiber pattern has a porosity of greater than 60%.

In a twelfth embodiment, the present invention provides a method for making a conductive film as in any of the first through eleventh embodiments, wherein the fiber pattern is deposited as a random pattern.

In a thirteenth embodiment, the present invention provides a method for making a conductive film as in any of the first through twelfth embodiments, wherein the fiber pattern is deposited in a controlled pattern.

In a fourteenth embodiment, the present invention provides a method for making a conductive film as in any of the first through thirteenth embodiments, wherein the fiber pattern is deposited by a method selected from electrospinning, nanofibers by gas jet, nano-imprinting, electron beam lithography, photolithography, and shadow-mask patterning.

In a fifteenth embodiment, the present invention provides a method for making a conductive film as in any of the first through fourteenth embodiments, wherein the exposed metal is removed from the conductive metal film by a method selected from metal wet-etching and metal dry-etching.

In a sixteenth embodiment, the present invention provides a method for making a conductive film as in any of the first through fifteenth embodiments, wherein the exposed metal is removed from the conductive metal film by a metal wet-etching technique selected from the group consisting of soaking etching, stirring etching and rinsing etching.

In a seventeenth embodiment, the present invention provides a method for making a conductive film as in any of the first through sixteenth embodiments, wherein the exposed metal is removed by rinsing etching.

In an eighteenth embodiment, the present invention provides a method for making a conductive film as in any of the first through seventeenth embodiments, wherein the fiber pattern is formed of fibers having a diameter of less than 1 micron.

In a nineteenth embodiment, the present invention provides a method for making a conductive film as in any of the first through eighteenth embodiments, wherein the fiber pattern is removed from the protective conductive film by a process selected from dissolution, washing, plasma etching, and UV-ozone etching.

In a twentieth embodiment, the present invention provides a conductive film comprising a metal-coated substrate including a substrate with a metal pattern coated thereon. The metal pattern being in the form of one or more fibers having a diameter of less than 100 microns and the metal pattern having a porosity of greater than 60%, the conductive film exhibiting a sheet resistance of less than $1000\Omega/\square$ at a transmittance of greater than 60%.

In a twenty-first embodiment, the present invention provides a conductive film comprising a metal-coated substrate including a substrate with a metal pattern coated thereon. The metal pattern being in the form of one or more fibers having a diameter of less than 1 micron and the metal pattern having a porosity of greater than 90%, the conductive film exhibiting a sheet resistance of less than $10\Omega/\square$ at a transmittance of greater than 90%.

In a twentieth embodiment, the present invention provides a conductive film comprising a metal-coated substrate including a substrate with a metal pattern coated thereon. The metal pattern being in the form of one or more fibers having a diameter of less than 500 nm and the metal pattern having a porosity of greater than 95%, the conductive film exhibiting a sheet resistance of less than $1\Omega/\square$ at a transmittance of greater than 95%.

BRIEF DESCRIPTION OF THE DRAWINGS

FIG. 1 is a general schematic of the process steps of the present methods;

FIG. 2 is a general schematic showing fibers laid down on a conductive metal film and creating passageways that can be eliminated through annealing; and FIG. 3 is a general schematic showing another example of fibers laid down on a conductive metal film and creating passageways that can be eliminated through annealing.

DETAILED DESCRIPTION OF ILLUSTRATIVE EMBODIMENTS

The present invention provides conductive films and methods for making them. In some embodiments, the conductive film includes a metal-coated substrate including a substrate having a metal pattern coded thereon. The metal pattern is in the form of one or more fibers. The conductive films can be made to have both transmittance and sheet resistance superior to conductive films made with indium tin oxide (ITO). Such superior performance can be realized by forming the metal pattern coating with one or more fibers of small diameters, the fibers defining a pattern of high porosity.

The conductive films of this invention can be achieved through a particular process disclosed herein and schematically represented in FIG. 1. In a first depositing step 100, a conductive metal film 10 is deposited on a substrate 12 to form a metal-coated substrate 14. In a second depositing step 102, a fiber pattern 16 is then deposited on the conductive metal film 10 of the metal-coated substrate 14 to form a masked substrate 18. The fiber pattern 16 defines protected metal 20 and exposed metal 22 of the conductive metal film 10, and, in a subsequent removal step 104, the exposed metal 22 of the masked substrate 18 is removed to form a protected conductive film 24. In a subsequent removal step 106, the fiber pattern 16 is then removed from the protected conductive film 24 to expose the protected metal 20 and provide a metal pattern 26 on the substrate 12 thus providing the conductive film 30.

In some embodiments, after the second step 102 of depositing the fiber pattern 16, an annealing step 103 is practiced. In the annealing step 103, the fiber pattern 16 of the masked substrate 18 is annealed to increase the surface area of contact between the fiber pattern 16 and the conductive metal film 10. This is schematically represented in FIG. 1 and is further disclosed and exemplified herein below. Exposed metal is removed after the annealing step (i.e., step 104 follows).

The substrate may be chosen from virtually any substrate that is transparent and has transmittance over 60% in the visible light range. In some embodiments, the substrate is flexible. In some embodiments, the substrate is selected from glass, quartz, polymer films, and oxides. In some embodiments, the substrate is glass. In some embodiments, the substrate is a transparent substrate and may be chosen from the above materials. In some embodiments, transparent polymer films may be selected from polymeric films with transparency over 60%. In some embodiments, transparent polymer films may be selected from polyethylene terephthalates, polyethylene-naphthalates, and polycarbonates. In some embodiments, transparent polymer films may be selected from polyethylene terephthalates, polyethylene-naphthalates, and polycarbonates with transparency over 60%. In some embodiments, transparent oxides may be selected from oxides having a transparency over 60%. In some embodiments, transparent oxides may be selected from aluminum oxide, magnesium oxide, titanium oxide, tin oxide, and indium doped tin oxide. In some embodiments, transparent oxides may be selected from aluminum oxide, magnesium oxide, titanium oxide, tin oxide, and indium doped tin oxide having a transparency over 60%.

The conductive metal deposited onto the substrate as a film may be selected from virtually any conductive metal. In some embodiments, the conductive metal is selected from copper, nickel, aluminum, tungsten, titanium, chromium, iron, zinc, zirconium, niobium, molybdenum, tin, indium, silver, gold, platinum, lead, vanadium, manganese, cobalt, palladium and conductive alloys thereof. In some embodiments, the conductive metal is copper, which is a useful metal in light of its high conductivity and low cost.

In some embodiments, an adhesive layer is employed to help adhere the conductive metal to the substrate. Those of skill in the art will appreciate what materials will serve as a good adhesive for particularly chosen conductive metals. In some embodiments, the adhesive layer is selected from alumina, titanium, chromium, zinc, aluminum, molybdenum, nickel, and their alloys. In some embodiments, the conductive metal is copper, nickel, aluminum, tungsten, titanium, chromium, iron, zinc, zirconium, niobium, molybdenum, tin, indium, silver, gold, platinum, lead, vanadium, manganese, cobalt, palladium and conductive alloys and the adhesive is titanium, chromium, zinc, aluminum, molybdenum, nickel, and their alloys. In some embodiments, the conductive metal is copper and the adhesive is alumina. In some embodiments, the adhesive is first deposited followed by the conductive metal.

In some embodiments, the conductive metal film of the metal-coated substrate is 1000 µm thick or less. In other embodiments, the conductive metal film is 100 µm thick or less, in other embodiments, 10 µm thick or less, in other embodiments, 1 µm thick or less, and in other embodiments, 100 nm thick or less.

The conductive metal film may be deposited by any suitable method to create the metal-coated substrate. In some embodiments, the conductive metal film is deposited by a method selected from electron beam evaporation, thermal evaporation, electrolysis plating, electro plating, chemical vapor deposition, and sputtering. If an adhesive layer is employed, it may be deposited by any suitable method, including electron beam evaporation, thermal evaporation, electrolysis plating, electro plating, chemical vapor deposition, and sputtering.

The fiber pattern deposited on the conductive metal film of the metal-coated substrate can be provided by any suitable material that serves to protect the metal (i.e., protected metal) it coats from a subsequent step of removing the metal that it does not coat (i.e., exposed metal). The material chosen must also be suitable for being deposited in the desired fiber pattern.

In particular embodiments, the fiber pattern is formed of a polymer. In some embodiments, the polymer is selected from polyacrylonitrile (PAN), polyethylene oxide (PEO), poly(methal methacrylate) (PMMA), polycaprolactone, polystyrene, Poly(vinyl acetate), acrylate polymers, styrene polymers, poly olefins, and any polymers and copolymers that can be used in electrospinning process.

In some embodiments, the fiber pattern is formed of one or more fibers having a diameter of 100 µm or less. In other embodiments, the fiber pattern is formed of one or more fibers having a diameter of 75 µm or less, in other embodiments, 50 µm or less, in other embodiments, 25 µm or less, in other embodiments, 10 µm or less, in other embodiments, 7.5 µm or less, in other embodiments, 5 µm or less, in other embodiments, 3 µm or less, in other embodiments, 2 µm or less, in other embodiments, 1 µm or less, in other embodiments, 500 nanometers (nm) or less, in other embodiments, 300 nm or less, in some embodiments, 200 nm or less, and in some embodiments, 100 nm or less. In some embodiments the entirety of the fiber pattern is formed by fibers having the above ranges.

One of the advantages of the present method is that the fiber pattern does not have to be too dense. In other words, it does not have to coat the entire substrate and can provide a significant degree of porosity, while still providing an acceptably conductive film after the end step. Thus, only a small amount of protective fiber is needed to form the fiber pattern, and, after removal of exposed metal, only a small amount of conductive metal is actually utilized to create the conductive film. Notably, in many instances the etched metal can be reclaimed. This will be appreciated as resulting in cost savings in creating an acceptable conductive film.

In some embodiments, the fiber pattern has a porosity of 50% or greater. In other embodiments, the fiber pattern has a porosity of 60% or greater, in other embodiments, 70% or greater, in other embodiments, 75% or greater, in other embodiments, 80% or greater, in other embodiments, 85% or greater, in other embodiments, 90% or greater, in other embodiments, 95% or greater, and in other embodiments, 98% or greater.

In some embodiments, the fiber pattern is deposited as a random pattern. For example, this would be achieved by employing standard electrospinning to lay down the fiber pattern on the conductive metal film. In other embodiments, the fiber pattern is deposited in a controlled pattern. In some embodiments, the fiber pattern is deposited in substantially parallel fibers traversing the substrate in a given direction. For example, this could be achieved by collecting electrospun fibers on a metal-coated substrate mounted around a rotating drum employed to collect the fiber. In other embodiments, a fiber pattern has a first set of substantially parallel fibers traversing the substrate and a second set of substantially parallel fibers crossing the first set of parallel fibers.

In some embodiments, the fiber pattern is deposited by a method selected from electrospinning, nano fibers by gas jet, nano-imprinting, electron beam lithography, photo lithography, and shadow-mask patterning.

In particular embodiments, the fiber pattern is deposited by electrospinning, which is a useful technique for producing the desired small diameter fibers through a high manufacturing rate per unit area.

It should be appreciated that, while electrospinning may sometimes technically result in the creation of a single long continuous fiber randomly patterned or purposefully patterned on the substrate, the use of the term "fibers" should be understood as accompanying such a long continuous fiber. It should also be appreciated that sometimes the long continuous fiber being laid down through electrospinning can break, thus creating multiple fibers. The intent is that the scope and understanding of this invention should not be limited to any pedantic reliance on the interpretation of "fiber" or "fibers". The fiber pattern of this invention may be considered to be formed by "fibers" even if formed by one long continuous unbroken fiber.

It would be appreciated that when one or more fibers lay on top of each other when deposited on the conductive metal film, there may be a passage way formed under one of the fibers. This can be seen in FIGS. 2 and 3. FIG. 2 shows a first fiber 40 having a second fiber 42 deposited over the first fiber 40 and extending downward to contact the conductive metal film 10. This has created a passageway 44 between the second fiber 42 and the conductive metal film 10. The metal under this passageway 44 is not protected by the second fiber 42, as it is only the metal that is contacted by the fibers that will be protected in the subsequent step of removing exposed metal. In FIG. 3, a first fiber 50 lays atop both a second fiber 52 and third fiber 54 to create a bridge-like passageway 56 and potentially additional passageway 58, and the entire length of fiber 50 from its contact with fiber 52 to its contact with fiber 54 fails to contact the conductive metal film 10. The conductive metal film under this passageway 56 will not be protected in a subsequent step of removing exposed metal. Thus, in some embodiments, an annealing step is carried out after depositing the fiber pattern.

In the annealing step, the fiber pattern is annealed so that these passageways are eliminated by causing the fibers to soften and flow to then lay down on the metal substrate where they previously created a passageway. This may be achieved by solvent annealing, thermal annealing, laser heating, UV curing and combinations thereof.

Suitable solvents for solvent annealing will be known to those of skill in the art. By way of example, when PAN fibers are employed, dimethalformamide (DMF), N-methyl-2-pyrrolidone (NMP, toluene, and dimethyl sulfoxide (DMSO) would be suitable. When PEO fibers are employed, water, ethanol, methanol, and isopropanol would be suitable. When PMMA fibers are employed, toluene, DMF, NMP, and anisole would be suitable.

As noted, the fiber pattern does not coat the entire surface area of the conductive film. Instead, there is a good deal of porosity. The fiber pattern will be understood to create protected metal at those areas where the fibers contact the conductive metal film and exposed metal, where the fibers do not contact the conductive metal film. The fiber pattern thereby serves as a mask for protecting the protected metal from subsequent removal. The exposed metal is removed by any suitable method. In some embodiments, the exposed metal is removed from the conductive metal film by a method selected from metal wet-etching and metal dry-etching. In some embodiments, as appropriate, wet-etching can be achieved used copper etchant, aluminum etchant, nickel etchant. In some embodiments, the metal dry-etching can be achieved by ion milling. In some embodiments, the exposed metal is removed from the conductive metal film by a metal wet-etching technique selected from the group consisting of soaking etching, stirring etching, and rinsing etching. In some embodiments, the exposed metal is removed by rinsing etching as described more fully below.

During development of the present invention, it was noticed that wet etching processes result in some undercutting of the fiber pattern, thus at least partially etching some of the protected metal. It was further found that, with fiber diameters of a micrometer or less, these undercuts can significantly undermine the structure of the masked metal pattern. Thus, when diameters of the fibers of the fiber pattern are around a micrometer or less, conventional static soaking methods are not very desirable, though they may result in acceptable conductive films. Thus, in some embodiments, a rinse etching method is employed wherein etching solution is quickly passed through the surface of electrospun fiber covered metal film.

While static soak etching, stirring etching and rinsing etching are all viable options, it has been found that rinsing etching generates a well pattern fiber network with clean background. Stirring etching can result in residues left in the exposed metal areas. Static soak etching can often result in the lack of any useful patterning because of the undercut effect.

Removing the exposed metal forms what is called herein a "protected conductive film." This consists of the substrate with a pattern of conductive metal thereon, coated by the fiber pattern that protected that metal in the step of removing the exposed metal. To create the final end product conductive film, the fiber pattern that protects the conductive metal is removed to expose the protected metal and provide a metal pattern on the substrate. The fiber pattern can be removed by any method suitable for removing the fiber pattern without negatively effecting the substrate or the conductive metal under the fiber pattern. in some embodiments, the fiber pattern is removed from the protective conductor film by a process selected from dissolution, washing, plasma etching, and UV-ozone etching.

In some embodiments, conductive films in accordance with this invention exhibit a sheet resistance of 1,000Ω/□ or less. In other embodiments, conductive films of this invention exhibit a sheet resistance of 100Ω/□ or less, in other embodiments, 10Ω/□ or less, in other embodiments, 1Ω/□ or less and, in other embodiments, 0.1Ω/□ or less. In some embodiments, the conductive films of this invention have a transmittance of 60% or more, in other embodiments 70% or more, in other embodiments 80% or more, in other embodiments 90% or more, and in other embodiments 95% or more, and, in other embodiments, 99% or more.

In some embodiments, conductive films in accordance with this invention exhibit a sheet resistance of 1,000Ω/□ or less, with a transmittance of 60%, in some embodiments, 70% or more, in some embodiments, 80% or more and, in some embodiments, 90% or more. In some embodiments, conductive films in accordance with this invention exhibit a sheet resistance of 100Ω/□ or less, with a transmittance of 60%, in some embodiments, 70% or more, in some embodiments, 80% or more and, in some embodiments, 90% or more. In some embodiments, conductive films in accordance with this invention exhibit a sheet resistance of 10Ω/□ or less, with a transmittance of 60%, in some embodiments, 70% or more, in some embodiments, 80% or more and, in some embodiments, 90% or more. In some embodiments, conductive films in accordance with this invention exhibit a sheet resistance of 1Ω/□ or less, with a transmittance of 60%, in some embodiments, 70% or more, in some embodiments, 80% or more and, in some embodiments, 90% or more. In some embodiments, conductive films in accordance with this invention exhibit a sheet resistance of 0.1Ω/□ or less, with a transmittance of 60%, in some embodiments, 70% or more, in some embodiments, 80% or more and, in some embodiments, 90% or more.

Processes in accordance with this invention provide conductive films comprising a metal-coated substrate including a substrate with a metal pattern coated thereon, the metal pattern being in the form of one or more fibers. In some embodiments, the fibers have a diameter of 1000 μm or less and the metal pattern has a porosity of 60% or more. In some embodiments, the conductive film exhibits a diameter of 100 μm or less at a transmittance of 60% or more. In some embodiments, the conductive film exhibits a diameter of 10 μm or less at a transmittance of 60% or more. In some embodiments, the conductive film exhibits a diameter of 1 μm or less at a transmittance of 60% or more. In some embodiments, the conductive film exhibits a diameter of 100 nm or less at a transmittance of greater than 60%.

In specific embodiments, the substrate is selected from glass, quartz, PET and PEN, the fibers are formed into a fiber pattern by electrospinning onto the substrate. The fibers have a diameter of from 10 μm or less to 10 nm or more, and form a fiber pattern having a porosity of from 60% to 90% or more. The exposed metal is removed by rinsing etching, and the fiber pattern is removed by dissolving the fibers in an appropriate solvent (i.e., one that readily dissolves the fiber).

In some embodiments, the conductive films of the present invention are employed as electrodes. In some embodiments, the conductive films are employed as touch screens. In other embodiments, the conductive films are employed as resistive heating films. In some embodiments, the resistive heating films are used in de-icing applications. In some embodiments, the conductive films are employed as anti-electromagnetic coatings.

It will be appreciated that, in various applications, the nanowires formed by this method will be attached to appropriate circuits for carrying out the intended function of the film. To provide easy connection points, at least a portion of the metal film can be protected from the etching process, for example, as shown in the Example below.

In light of the foregoing, it should be appreciated that the present invention significantly advances the art by providing a conductive metal film that is structurally and functionally improved in a number of ways. While particular embodiments of the invention have been disclosed in detail herein, it should be appreciated that the invention is not limited thereto or thereby inasmuch as variations on the invention herein will be readily appreciated by those of ordinary skill in the art. The scope of the invention shall be appreciated from the claims that follow.

EXAMPLES

Materials

Polyacrylonitrile powder with molecular weight 150 000 was purchased from Scientific Polymer, Inc. Iron(III) chloride (FeCl3, 98%) powder was purchased from Alfa Aesar. Dimethylformamide (DMF, 99.8%) was received from EMD chemicals Inc. Copper (99.99%) was received from IAmaterials. Aluminum oxide (99.99%) was received from Kamis.

Preparation of Cu Nanowire Electrode

For the metal film deposition, 2 nm Al2O3 and copper with different thickness (100 or 50 nm on glass and 60 nm on PET in this work) were deposited by electron-beam deposition using a customized Denton e-beam evaporator under a pressure of $2\times10^{-5}$ Torr. Polyacrylonitrile solution (12 wt % PAN) was prepared by adding polymer powder to dimethylformamide (DMF). The solution was stirred in a water bath at 80° C. for 2 h to ensure the complete dissolution of solid polymer. A voltage of 6 kV and a positive pressure of 27 KPa were applied to the solution to spin the fibers out of a glass capillary with an outer diameter of 0.5 mm. The copper-coated substrates were placed under the capillary to collect PAN fibers. The nanofibers were collected in 30 s. The distance from the capillary tip to the sample surface was 12 cm. The electrospun PAN nanofibers on the substrates were solvent annealed. A compressed air stream was passed through a hot DMF container (75° C.) to the neck of a funnel. The sample was supported at the mouth of the funnel for 1 to 3 min. The copper was etched by rinsing it on a holder and was rinsed serially with 1 L of 0.003 M FeCl3 aqueous solution followed by 1 L of 0.0015 M FeCl3 aqueous solution. In the final step, the PAN nanofibers were removed by immersing the sample into hot DMF (50° C.) for 3 min.

Characterization

The sheet resistances of the films were measured using a digital Keithley 2000 multimeter with a Pro-4 Lucas Lab four-point probe to eliminate contact resistance. Ten randomly selected points on each 2.54×2.54 cm sample were measured. Both the mean value and standard deviation were recorded. The optical transmittance was obtained by using a Cary 100Bio UV-visible spectrophotometer. The optical images were taken with an Olympus DP70 optical microscope. SEM images were collected with a JEOL JSM-7401 field emission SEM.

Results and Discussion

In this work, the electrospun fibers are used as a mask to create metal nanowires on transparent substrates. The fabrication procedure is illustrated in FIG. 1. First, the conductive metal film is deposited on the transparent substrates such as glass or transparent polymer sheets. Second, polyacrylonitrile (PAN) fibers are electrospun onto the surface of the metal film. In the third step, a solvent annealing process is conducted to flatten the PAN fibers onto the metal surface. Then in step four, the coated transparent sheet is immersed into a metal etching solution to remove the metal that is not protected by the PAN fibers. Finally, the PAN fibers are removed by an organic solvent, and the transparent electrode is ready to be tested and used.

Copper is the metal of choice in this work because of its high conductivity and low cost. In a typical case, a 2 nm thick layer alumina (Al2O3) and a 100 nm copper layer are deposited in that order on glass slides by electron-beam evaporation in series. The Al2O3 is used as an adhesive layer to enhance the adhesion between the copper film and glass substrate. Electrospun nanofiber networks provide percolating paths, even when the number of fibers per unit area is small. The electrospun fiber network is formed by very long continuous fibers. The resulting metal nanowire patterns are therefore completely connected everywhere. In contrast, unconnected nanowires or nanotubes are often found in CNT or solution-processed metal nanowire electrodes. Such isolated nanowires/nanotubes reduce transmittance without enhancing conductivity. Second electrospinning is the best technique that provides small feature with high manufacturing rate per unit area. Lithography techniques such as nanoimprinting and e-beam lithography can generate even smaller nanowires than electrospun fibers, but they require expensive instruments and have limited productivity. Conventional photolithography and shadow-mask patterning can provide metal wire patterns with relatively high throughput, but the widths of the metal wires are usually larger than a micrometer. In transparent percolation electrode, the aspect ratio of length of metal nanowires vs the diameter and the number of the nanowires determines the performance. Electrospinning leads to high conductivity networks and easy optimization of the balance of the length between connection points, cross sectional area of the metal conductor, and number of conducting segments per unit area.

Scanning electron microscope (SEM) images of the as prepared PAN fiber on copper substrates showed the diameter of the PAN fiber in this work is typically between 650 and 700 nm. Initial etching experiments without solvent softening of the PAN nanofibers did not protect the copper. The as prepared fibers stacked with each other, and many segments did not contact the copper surface directly. From the SEM images, it was clear that some fibers could be suspended above others. In order to transfer the entire PAN nanofiber pattern to the copper layer, all PAN nanofibers need to contact the copper surface. Therefore, a solvent wetting process was used in this work. DMF was heated by a water bath (75±5° C.), and the vapor was guided by an air stream to a glass funnel directly above the sample. The wetting level should be controlled accurately in order to obtain optimal contact between with the fibers and the copper surface without distorting the shape of the fibers. In our experiments, the wetting time was typically between 1 and 3 min with an air flow rate of 750 mL/min. After the samples were treated by this wetting process, most segments of the PAN fibers contacted the copper surface. In addition, the junctions of the fibers are conglutinated. Although the sizes of the final copper nanowire are theoretically controlled by both wetting procedure and the following etching procedure, it was found in this work that the control of the wetting was a lot easier. In this example, the stepwise wetting gradually changed transmittance from 60 to 90%.

Another key step in this work is the wet-etching process. The wet-etching of copper is an anisotropic process; therefore, undercutting is typically observed during the process. When the feature size is close to a micrometer, undercuts become a serious problem. When the diameters of electrospun fibers are all under a micrometer, conventional static soaking methods do not work well. As shown in Table 1, it was almost impossible to prepare samples at a size of 2.54×2.54 cm by static soaking. This undercut problem was not solved by using copper etchants with different concentration (FeCl3 0.001-0.1 M) or different etchants (FeCl3, (NH4)2S2O8, and CuSO4+H2SO4). A rinsing etching method was adopted. The agitation of etching solution (stirring etching) helped to suppress undercutting by rapidly exchanging the etching solution on the metal surface. Static soaking, stirring, and rinsing etching were tried. From the optic images, it was clear that that the static soak etching did not give any useful patterning because of the undercut effect. The stirring etching (using a magnetic stir-bar to agitate the etching solution) formed nanowires pattern, but residues were left in the open areas. The rinsing etching generated well patterned fiber networks with clean background.

With optimized rinsing etching condition, the pattern of the PAN nanofibers was reproduced in the copper substrate. The PAN fibers protected the underlying copper substrate during rinsing etching, while the copper in the exposed region was removed completely. SEM EDAX mapping clearly indicated the copper nanowires were well patterned under the polymer fibers. SEM images of the final copper nanowire on the glass substrate after the PAN was removed by hot DMF had widths between 550 and 800 nm, which are very close to the diameters of PAN nanofibers. It is worth emphasizing that the rinsing etching is an efficient and reliable method to produce transparent metal nanowire electrodes with yields over 90%.

2.54×2.54 cm size transparent electrodes on glass substrates with copper nanowire exhibited transmittance from 68 to 90% (at 550 nm). The sheet resistance was between 2 and 24Ω/□. The transmittance of the electrode is mostly controlled in the wetting step. The samples with 68, 74, 83% transmittance were obtained from a 100 nm thick copper film on the glass. The sample with 90% transmittance was obtained from a 50 nm thick copper film on the glass. The transparent electrodes showed similarly high transmittance throughout the wavelength range between 400 and 800 nm.

This method was used to fabricate flexible transparent electrodes. The only change required is to use polyethylene terephthalate substrate to replace glass substrate. Copper nanowire-based flexible transparent electrode was fabricated with high yield. The sheet resistance and transmittance of the rigid and flexible transparent electrodes prepared in this work were recorded. The reported sheet resistances are average values of 10 measurements. The performance of the transparent electrodes fabricated in this work is better than ITO, CNT, and graphene-based electrodes. The result is also better than the solution-processed copper nanowire and comparable with the best results of solution-processed silver nanowire transparent electrodes. Although the diameters of the solution-processed copper nanowire are smaller, the transparent electrodes from them are less conductive. The performance of the transparent electrodes in this work is comparable with our previous work (Zhu, Y.; Sun, Z.; Yan, Z.; Jin, Z.; Tour, J. M. Rational Design of Hybrid Graphene Films for High-Performance Transparent Electrodes. ACS Nano 2011, 5, 6472-6479). However, the previous work requires expensive photolithography tools. The metal nanowires from photolithography are much larger (>2 □m), which requires a coarser grid (200 □m) to reach high transparency. In this work, the copper wires (avg. ~650 nm) were much smaller and were fabricated at a higher rate per unit area. Recent work used evaporated metal and electrospinning methods with good results because the width of electrospun fibers was smaller (245 nm in that work vs 650 nm in this work). Wu, H.; Kong, D.; Ruan, Z.; Hsu, P. C.; Wang, S.; Yu, Z.; Carney, T. J.; Hu, L.; Fan, S.; Cui, Y. A Transparent Electrode Based on a Metal Nanotrough Network. Nat. Nanotechnol. 2013, 8, 421-425. However, the free-standing metal nanotrough needs to be transferred and adhered to other substrate, which increases the fabrication cost. In this work, no transfer process is required because the transparent electrodes are directly formed on the transparent substrate. We expect that if the smaller electrospun fibers are used in the process described here, better properties will be obtained. Nevertheless, the figure of merit result based on the percolation theory indicates that our results are certainly among the best reports for metal nanowire based transparent electrode.

Percolation theory can be used to predict the non-linear relation between sheet resistance Rs and transmittance T in nanowire networks. The fitting results of the performance of the copper nanowire electrodes in this work are based on the following percolation equation:

$$T = \left[1 + \frac{1}{\Pi}\left(\frac{Z_0}{R_s}\right)^{\frac{1}{n+1}}\right]^{-2}$$

where T is the light transmittance, Rs is the sheet resistance, $Z_0$ is the impedance of free space (377Ω), n is the percolation exponent and $\Pi$ is the percolative figure-of-merit (FOM). $\Pi$ follows the relation:

$$\Pi = 2\left[\frac{\sigma_{dc}/\sigma_{op}}{(Z_0 t_{min}\ \sigma_{op})^2}\right]^{\frac{1}{n+1}}$$

where $\sigma_{dc}$ is the dc conductivity, $\sigma_{op}$ the optical conductivity, tmin the thickness below which dc conductivity becomes thickness dependent. Previous report shows that large values of π and low values of n are required for high performance percolative transparent electrode. Based on the fitting results, the percolation exponent n and FOM π are 0.78 and 89 for this work, respectively. The results are compared with literature sources in Table 1.

TABLE 1

Percolation Parameters of this work and other literature

|  | n | Π |
|---|---|---|
| Cu nanowire (this work) | 0.78 | 89 |
| Metal nanowire | .81 | 47 |
| Silver nanowire | 3.7 | 26 |
| Cu nanotrough | 0.63 | 361 |

Metal nanowire—De, S.; Coleman, J. N. The Effects of Percolation in Nanostructured Transparent Conductors. MRS Bull. 2011, 36, 774-781.

Silver nanowire—Scardaci, V.; Coull, R.; Lyons, P. E.; Rickard, D.; Coleman, J. N. Spray Deposition of Highly Transparent, Low-Resistance Networks of Silver Nanowires over Large Areas. Small 2011, 7, 2621-2628.

Cu Nanowire—Wu, H.; Kong, D.; Ruan, Z.; Hsu, P. C.; Wang, S.; Yu, Z.; Carney, T. J.; Hu, L.; Fan, S.; Cui, Y. A Transparent Electrode Based on a Metal Nanotrough Network. Nat. Nanotechnol. 2013, 8, 421-425.

In addition to the excellent transmittance and conductivity, the transparent electrodes in this work exhibit outstanding toughness. The transparent electrodes were evaluated in various bending tests and adhesion tests. In the bending test, the flexible transparent electrode was fixed between two clamps and then bent by pushing the two clamps together. The resistance of electrodes was measured throughout the test and did not change over 10% when the bending radius changes from 51 to 1.25 mm. In comparison, previous copper nanotrough electrode was bent up to 2 mm radius, and the resistance of silver nanowire electrode 7 changed ~16% when the bending radius is 1.3 mm. The bending radius is calculated using the following equation:

$$\begin{cases} \frac{d}{2r} = \sin\left(\frac{L}{2r}\right) & \left(d > \frac{2l}{\pi}\right) \\ r = \frac{d}{2} & \left(d < \frac{2l}{\pi}\right) \end{cases}$$

where d is the distance between two clamps, L is the length of the electrode, and r is the bending radius. A repeated fatigue bending test showed that the flexible electrode maintained its performance even after bending 1000 times to a radius of 14 mm. A fresh 3M tape (Scotch Magic 810 tape) was attached to a 2.54×2.54 cm transparent electrode and then was peeled off by hand. The resistance of the electrode was monitored throughout the taping and peeling process. The results indicated that there was no obvious change on the resistance of the electrode after 50 cycles of taping and peeling. As far as we know, such an excellent adhesion is only available with commercial ITO.

The toughness and high performance of the new transparent electrode make it useful in many optoelectronics applications. The compatibility, low fabrication cost and high manufacturing throughput make it a promising method to produce large are transparent electrodes. Flexible transparent electrodes (6×6 cm) were fabricated and were used to make resistive touch screen devices. The transfer-free procedure eliminates protruding spots, which is very important for thin film devices like touch screens. This protruding-free film is confirmed by both AFM experiment and smooth touch screen writing experience. The transparent electrode fabrication process can be easily integrated with electric circuit patterning.

CONCLUSION

In this work, a tough and high performance transparent electrode was fabricated by using electrospun fiber as mask pattern. The patterning method is cost effective and produces large area per unit time. The reported fabrication procedure is free of the transfer step that complicates many other metal nanowires, CNT, or graphene-based transparent electrodes. The protruding spots do not occur on the transparent electrode. The transparent electrodes have a sheet resistance of 6Ω/□ at 83% transmittance or 24Ω/□ at 92% transmittance. The fabrication method works well with both rigid glass substrates and flexible PET substrates. The resulting transparent electrodes show excellent adhesion and bending. A touch screen device based on the flexible transparent electrode was demonstrated.

What is claimed is:

1. A method for making a conductive film comprising the steps of:
   depositing a conductive metal film on a substrate to form a metal-coated substrate;
   depositing a fiber pattern on the conductive metal film of the metal-coated substrate to form a masked substrate, wherein the fiber pattern is deposited by a method selected from the group consisting of electrospinning and nanofibers by gas jet, the fiber pattern defining protected metal and exposed metal of the conductive metal film;

removing the exposed metal from the conductive metal film of the masked substrate to form a protected conductive film; and removing the fiber pattern from the protected conductive film to expose the protected metal and provide a metal pattern on the substrate.

2. The method of claim 1, further comprising:

annealing the fiber pattern of the masked substrate to increase the surface area of contact between the fiber pattern and the conductive metal film.

3. The method of claim 1, wherein the substrate is a transparent substrate.

4. The method of claim 3, wherein the substrate is selected from glass, quartz, transparent polymer film, and transparent oxide.

5. The method of claim 1, wherein the conductive metal is selected from copper, nickel, aluminum, tungsten, titanium, chromium, iron, zinc, zirconium, niobium, molybdenum, tin, indium, silver, gold, platinum, lead, vanadium, manganese, cobalt, palladium and alloys of the foregoing.

6. The method of claim 1, wherein the conductive metal film is deposited by a method selected from electron beam evaporation, electroless plating, electroplating, chemical vapor deposition, and sputtering.

7. The method of claim 1, wherein the conductive metal film in the metal-coated substrate is less than 1000 microns thick.

8. The method of claim 1, wherein the fiber pattern is formed of a polymer.

9. The method of claim 1, wherein the fiber pattern is formed of fibers having a diameter of less than 100 microns.

10. The method of claim 9, wherein the fiber pattern is formed of fibers having a diameter of less than 1 micron.

11. The method of claim 1, wherein the fiber pattern has a porosity of greater than 60%.

12. The method of claim 1, wherein the fiber pattern is deposited as a random pattern.

13. The method of claim 1, wherein the fiber pattern is deposited in a controlled pattern.

14. The method of claim 1, wherein the exposed metal is removed from the conductive metal film by a method selected from metal wet-etching and metal dry-etching.

15. The method of claim 1, wherein the exposed metal is removed from the conductive metal film by a metal wet-etching technique selected from the group consisting of soaking etching, stirring etching and rinsing etching.

16. The method of claim 15, wherein the exposed metal is removed by rinsing etching.

17. The method of claim 16, wherein the fiber pattern is formed of fibers having a diameter of less than 1 micron.

18. The method of claim 1, wherein the fiber pattern is removed from the protective conductive film by a process selected from dissolution, washing, plasma etching, and UV-ozone etching.

* * * * *